(12) United States Patent
Ko et al.

(10) Patent No.: US 9,176,196 B2
(45) Date of Patent: Nov. 3, 2015

(54) APPARATUS AND METHOD FOR MANAGING BATTERY APPLICATION ENVIRONMENT AND USAGE HISTORY

(71) Applicant: LG CHEM, LTD., Seoul (KR)

(72) Inventors: Jong-Kyung Ko, Daejeon (KR); Jong-Min Park, Daejeon (KR); Seung-Min Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/248,826

(22) Filed: Apr. 9, 2014

(65) Prior Publication Data
US 2014/0222359 A1  Aug. 7, 2014

Related U.S. Application Data

(63) Continuation of application No. PCT/KR2013/011029, filed on Nov. 29, 2013.

(30) Foreign Application Priority Data

Nov. 30, 2012 (KR) .......... 10-2012-0138379
Nov. 28, 2013 (KR) .......... 10-2013-0146526

(51) Int. Cl.
*G06F 17/40* (2006.01)
*G06F 19/00* (2011.01)
(Continued)

(52) U.S. Cl.
CPC ............ *G01R 31/3606* (2013.01); *G01K 1/026* (2013.01); *G01K 3/005* (2013.01); *H01M 10/42* (2013.01); *G06F 17/40* (2013.01); *G06F 19/00* (2013.01)

(58) Field of Classification Search
CPC ......... G01D 7/00; G01D 9/00; G01D 21/00; G01K 1/00; G01K 1/02; G01K 1/026; G01K 3/00; G01K 3/005; G01R 19/00; G01R 19/165; G01R 19/175; G01R 31/00; G01R 31/36; G01R 31/3606; G06F 11/00; G06F 11/30; G06F 11/32; G06F 11/34; G06F 15/00; G06F 15/16; G06F 17/00; G06F 17/10; G06F 17/40; G06F 19/00; H01M 10/00; H01M 10/42
USPC ....... 73/432.1, 865.8, 865.9, 866.3; 324/76.11, 157; 340/500, 540, 635, 340/636.1, 636.13, 636.19; 374/100, 101, 374/102; 377/1, 13, 15, 16; 700/90, 299; 702/1, 33, 34, 57, 60, 61, 62, 127, 130, 702/136, 182, 187, 189; 708/100, 105, 200
See application file for complete search history.

(56) References Cited

U.S. PATENT DOCUMENTS 2,883,255 A * 4/1959 Anderson .......... 346/34
3,362,217 A * 1/1968 Rush et al. .......... 73/112.01
(Continued)

FOREIGN PATENT DOCUMENTS

DE 10 2010 031 337 A1 1/2012
EP 1 387 177 A2 2/2004
(Continued)

OTHER PUBLICATIONS

International Search Report, Issued in PCT/KR2013/011029, dated Mar. 14, 2014.
(Continued)

*Primary Examiner* — Edward Cosimano
(74) *Attorney, Agent, or Firm* — Birch, Stewart, Kolasch & Birch, LLP

(57) ABSTRACT

Disclosed is an apparatus and method for managing a battery that may manage a surrounding environment and a usage history of the battery. The battery management apparatus senses a temperature of an environment to which the battery is exposed, and stores a period of time during which the battery is exposed to a high temperature when the sensed temperature corresponds to a preset first or second area. In this instance, the battery management apparatus may determine whether the battery is simply exposed to the high temperature or the battery is charged or discharged while exposed to the high temperature, and store a usage time together. According to the present disclosure, information about a time domain affecting the life or performance of the battery may be calculated in consideration of the temperature environment to which the battery is exposed.

20 Claims, 5 Drawing Sheets

(51) Int. Cl.
  *G01R 31/36* (2006.01)
  *G01K 1/02* (2006.01)
  *G01K 3/00* (2006.01)
  *H01M 10/42* (2006.01)

(56) References Cited

U.S. PATENT DOCUMENTS

| | | | |
|---|---|---|---|
| 5,504,416 A * | 4/1996 | Holloway et al. | 320/152 |
| 5,646,508 A * | 7/1997 | van Phuoc et al. | 320/152 |
| 5,652,502 A * | 7/1997 | van Phuoc et al. | 702/63 |
| 6,664,000 B1 * | 12/2003 | Sonobe | 429/61 |
| 6,836,122 B2 * | 12/2004 | Tojima | 324/426 |
| 8,633,826 B2 | 1/2014 | Kim | |
| 8,648,603 B2 * | 2/2014 | Harada | 324/431 |
| 2003/0231006 A1 * | 12/2003 | Tojima | 320/132 |
| 2004/0113629 A1 | 6/2004 | Laig-Hoerstebrock | |
| 2007/0090792 A1 | 4/2007 | Sim et al. | |
| 2011/0210859 A1 * | 9/2011 | Kim | 340/657 |
| 2012/0078549 A1 | 3/2012 | Oh | |
| 2013/0038333 A1 * | 2/2013 | Harada | 324/431 |
| 2013/0241567 A1 | 9/2013 | Boehm | |
| 2013/0278221 A1 | 10/2013 | Maeda | |

FOREIGN PATENT DOCUMENTS

| | | |
|---|---|---|
| JP | 3697818 B2 | 7/2005 |
| JP | 3702172 B2 | 10/2005 |
| KR | 2003-297437 A | 10/2003 |
| KR | 10-2004-0005133 A | 1/2004 |
| KR | 10-0686826 B1 | 2/2007 |
| KR | 10-2011-0077774 A | 7/2011 |
| KR | 10-20110130240 A | 12/2011 |
| WO | 2012/091076 A1 | 7/2012 |

OTHER PUBLICATIONS

Written Opinion of the International Searching Authority, issued in PCT/KR2013/011029, dated Mar. 14, 2014.

* cited by examiner

FIG. 5

| DEFINITION | LEVEL | TEMPERATURE RANGE(°C) | DESCRIPTION | BATTERY WARRANTY RANGE |
|---|---|---|---|---|
| SECOND AREA | SEVERE | 50 OR HIGHER | FAST BATTERY DEGRADATION | WARRANTY WITHIN PREDETERMINED PERIOD (EX: WARRANTY OF CONTINUOUS 1 HR AND TOTAL 24 HR OR LESS) |
| FIRST AREA | WARNING | 40~50 | POTENTIAL BATTERY DEGRADATION | WARRANTY WITHIN PREDETERMINED PERIOD (EX: WARRANTY OF CONTINUOUS 10 HR AND TOTAL 240 HR OR LESS) |
| ADEQUATE AREA | NORMAL | 0~40 | GOOD BATTERY PERFORMANCE | WARRANTY WITHIN BATTERY WARRANTY PERIOD OF BATTERY MANUFACTURER (EX: SERVICE LIFE-7 YEARS) |
| FIRST AREA | WARNING | -20~0 | POTENTIAL BATTERY DEGRADATION | WARRANTY WITHIN PREDETERMINED PERIOD (EX: WARRANTY OF CONTINUOUS 10 HR AND TOTAL 240 HR OR LESS) |
| SECOND | SEVERE | -20 OR LOWER | FAST BATTERY DEGRADATION | WARRANTY WITHIN PREDETERMINED PERIOD (EX: WARRANTY OF CONTINUOUS 1 HR AND TOTAL 24 HR OR LESS) |

APPARATUS AND METHOD FOR MANAGING BATTERY APPLICATION ENVIRONMENT AND USAGE HISTORY

CROSS-REFERENCE TO RELATED APPLICATION

The present application is a continuation of International Application No. PCT/KR2013/011029 filed on Nov. 29, 2013, which claims priority under 35 USC 119(a) to Korean Patent Application No. 10-2012-0138379 filed on Nov. 30, 2012 in the Republic of Korea and Korean Patent Application No. 10-2013-0146526 filed on Nov. 28, 2013 in the Republic of Korea, the disclosures of which are incorporated herein by reference.

TECHNICAL FIELD

The present disclosure relates to an apparatus and method for managing a battery, and more particularly, to an apparatus and method for managing an environment in which a battery is left unused and a history of battery use.

BACKGROUND ART

In response to growing market demand for light weight and high performance products, hardware and software for portable equipments such as video cameras, mobile phones, digital cameras, and the like, are dramatically being developed, and combined with this dramatic development, many studies are being made on a secondary battery as a power source for operating such equipment.

A secondary battery is not only commonly applied to portable equipments, but universally applied to an electric vehicle (EV) or a hybrid vehicle (HV) that is propelled by an electric motor.

A secondary battery for use in vehicles is gaining attention for its primary advantage of remarkably reducing the use of fossil fuels and not generating by-products from the use of energy, making it a new eco-friendly source of energy.

Generally, a battery (pack) for use in electric vehicles is implemented as an assembly consisting of a plurality of unit cells and a plurality of such assemblies, and the cell has a structure of being chargeable and dischargeable by an electrochemical reaction between elements including a cathode current collector, a separator, an active material, an electrolyte solution, an aluminum thin-film layer, and the like.

In addition to this basic structure for charging and discharging, the battery further includes a device for physical protection when cells are assembled into a battery, various sensing means, firmware with an accurate algorithm for state of charge (SOC) estimation, and the like.

Due to intrinsic characteristics of an electrochemical reaction occurring inside, the use of the battery made up of various chemical devices and electrical and physical devices is impermanent. Furthermore, due to these electrochemical reactions and the like, leakage current and the like may occur, which fails to ensure safety and so remains as one of the problems to be solved.

The intrinsic electrochemical or electrical and physical characteristics of the battery are unavoidably influenced by an external environment in which the battery is used, and the intrinsic electrochemical characteristics of the battery may suddenly change based on the external environment to which the battery is exposed, which thereby affects the life, safety or operation performance of the battery.

That is, the battery has an intrinsic attribute in that its electrical and physical characteristics degrade over time, and is sensitively influenced by its environment, for example, an external unfavorable condition such as temperature, a high current environment, a physical impact, overcharge, overdischarge, submergence, overmoisture, and the like. The longer the battery is exposed to this situation, the more it will decrease in battery life, which cannot guarantee that the battery will run within its optimal period, and since there are risks of explosion, this may become a fatal factor in threatening the safety of a car to which the battery is applied.

Therefore, there is a great need for improvement in user interfacing environment to control the management of a battery in consideration of various external environmental factors so as to maximize the stable management and normal operation of the battery and optimize the economical efficiency of the battery, and to take prompt or preliminary action when the battery is exposed to a dangerous level.

Also, medium- and long-term exposure of the battery to the above-mentioned unfavorable condition gradually increases a so-called fatigue of the secondary battery and deteriorates the electrochemical, electrical, and physical characteristics, leading to increased rates of battery degradation, which limits the time of normal operation, causing a reduction in the battery life.

DISCLOSURE

Technical Problem

The present disclosure is designed to solve the problems of the related art, and therefore, the present disclosure is directed to providing an apparatus and method for managing a battery that may manage a surrounding environment and a usage history of the battery.

Technical Solution

To achieve the above object, a battery management apparatus according to the present disclosure includes an external temperature sensor to sense a temperature of an environment to which a battery is exposed, a current sensor to sense an electric current of the battery, and a calculation unit to increase a first or second area non-use cumulative counter for a time domain when the temperature value received from the external temperature sensor corresponds to a preset first or second area and the current value received from the current sensor is 0, and to increase a first or second area use cumulative counter for the time domain when the temperature value received from the external temperature sensor corresponds to the preset first or second area and the current value received from the current sensor is greater than or less than 0.

According to an exemplary embodiment of the present disclosure, the first area is between 40° C. above zero and 50° C. above zero, not including 50° C. above zero, and the second area is higher than or equal to 50° C. above zero.

According to another exemplary embodiment of the present disclosure, the first area is between 20° C. below zero and 0° C., not including 20° C. below zero, and the second area is lower than or equal to 20° C. below zero.

According to still another exemplary embodiment of the present disclosure, the first area is between 40° C. above zero and 50° C. above zero, not including 50° C. above zero, and between 20° C. below zero and 0° C., not including 20° C. below zero, and the second area is between 50° C. above zero and 20° C. below zero.

The battery management apparatus according to the present disclosure may further include a control unit to output a control signal to limit the use of the battery when the first or second area non-use cumulative counter reaches a preset first or second area non-use time limit, or the first or second area use cumulative counter reaches a first or second area use time limit.

The battery management apparatus according to the present disclosure may further include a control unit to output a warning signal to a display means when the first or second area non-use cumulative counter reaches a preset first or second area non-use time limit, or the first or second area use cumulative counter reaches a preset first or second area use time limit.

When the temperature value received from the external temperature sensor corresponds to the preset first or second area and the current value received from the current sensor is greater than or less than 0, the calculation unit calculates a first or second area continuous use time, and the battery management apparatus according to the present disclosure may further include a control unit to output a control signal to limit the use of the battery when the first or second area continuous use time reaches a preset first or second area continuous use time limit.

When the temperature value received from the external temperature sensor corresponds to the preset first or second area and the current value received from the current sensor is greater than or less than 0, the calculation unit calculates a first or second area continuous use time, and the battery management apparatus according to the present disclosure may further include a control unit to output a warning signal to a display means when the first or second area continuous use time reaches a preset first or second area continuous use time limit.

The battery management apparatus according to the present disclosure may further include a memory unit to store the preset first and second areas, the first and second area non-use cumulative counters, and the first and second area use cumulative counters.

The battery management apparatus according to the present disclosure may further include an internal temperature sensor to sense a temperature of the battery, and the calculation unit stores the temperature value (or internal temperature value) received from the internal temperature sensor when the current value received from the current sensor is non-zero, subtracts a value proportional to the internal temperature value from the temperature value received from the external temperature sensor, and determines whether the result corresponds to the preset first or second area.

To achieve the above object, a battery management method according to the present disclosure includes a temperature measuring step of determining whether a temperature value received from an external temperature sensor to sense a temperature of an environment to which a battery is exposed corresponds to a preset first or second area, a non-use time increasing step of increasing a first or second area non-use cumulative counter for a time domain when the temperature value received from the external temperature sensor corresponds to the preset first or second area and a current value received from a current sensor to sense an electric current of the battery is 0, and a use time increasing step of increasing a first or second area use cumulative counter for the time domain when the temperature value received from the external temperature sensor corresponds to the preset first or second area and the current value received from the current sensor to sense the electric current of the battery is greater than or less than 0.

Advantageous Effects

According to an aspect of the present disclosure, information about a time domain that may affect the life or performance of a battery can be calculated in consideration of a temperature environment to which the battery is exposed.

According to another aspect of the present disclosure, information about whether the battery is simply exposed to or is applied in a temperature environment adversely affecting the battery can be calculated.

According to still another aspect of the present disclosure, based on the information, a life cycle of the battery or a warranty period of a battery manufacturer can be determined.

DESCRIPTION OF DRAWINGS

The accompanying drawing illustrates a preferred embodiment of the present disclosure and together with the foregoing disclosure, serves to provide further understanding of the technical spirit of the present disclosure, and thus, the present disclosure is not construed as being limited to the drawing.

FIG. 5 is a table illustrating a brief description of a first area and a second area according to an exemplary embodiment.

MODE FOR DISCLOSURE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, not intended to limit the scope of the disclosure, so it should be understood that other equivalents and modifications could be made thereto without departing from the spirit and scope of the disclosure.

Figure 1:
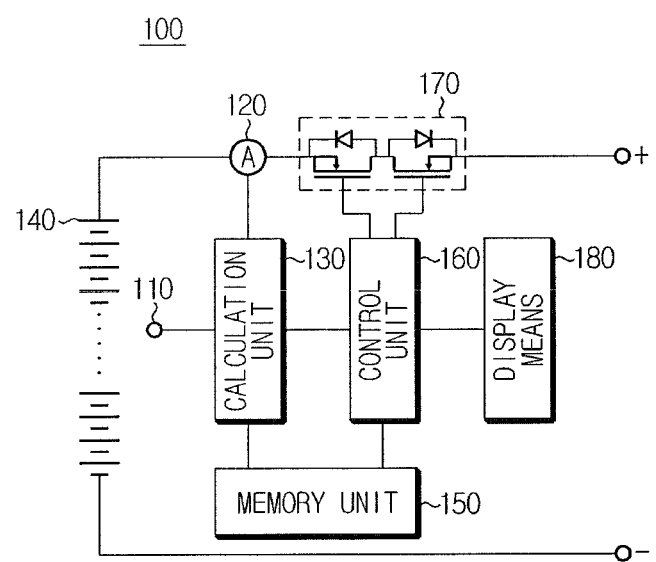
FIG. 1 is a block diagram schematically illustrating a configuration of a battery management apparatus according to an exemplary embodiment.
Figure 2:
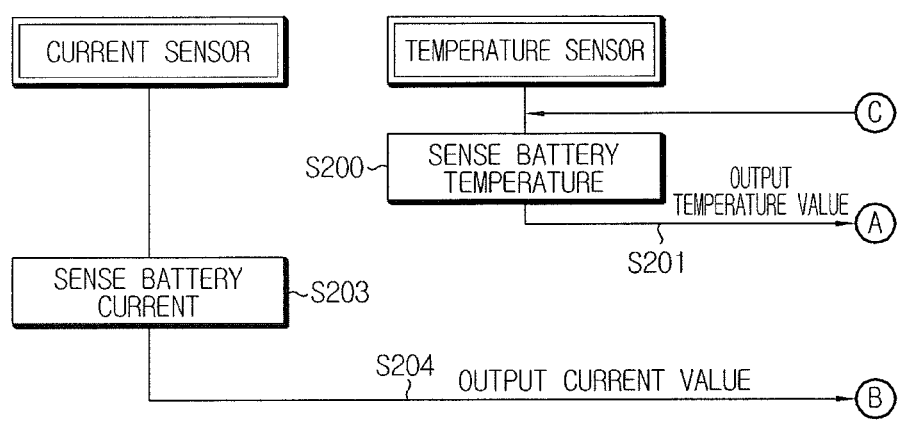
FIGS. 2 through 4 are flowcharts chronologically illustrating a battery management method according to an exemplary embodiment.
Figure 3:
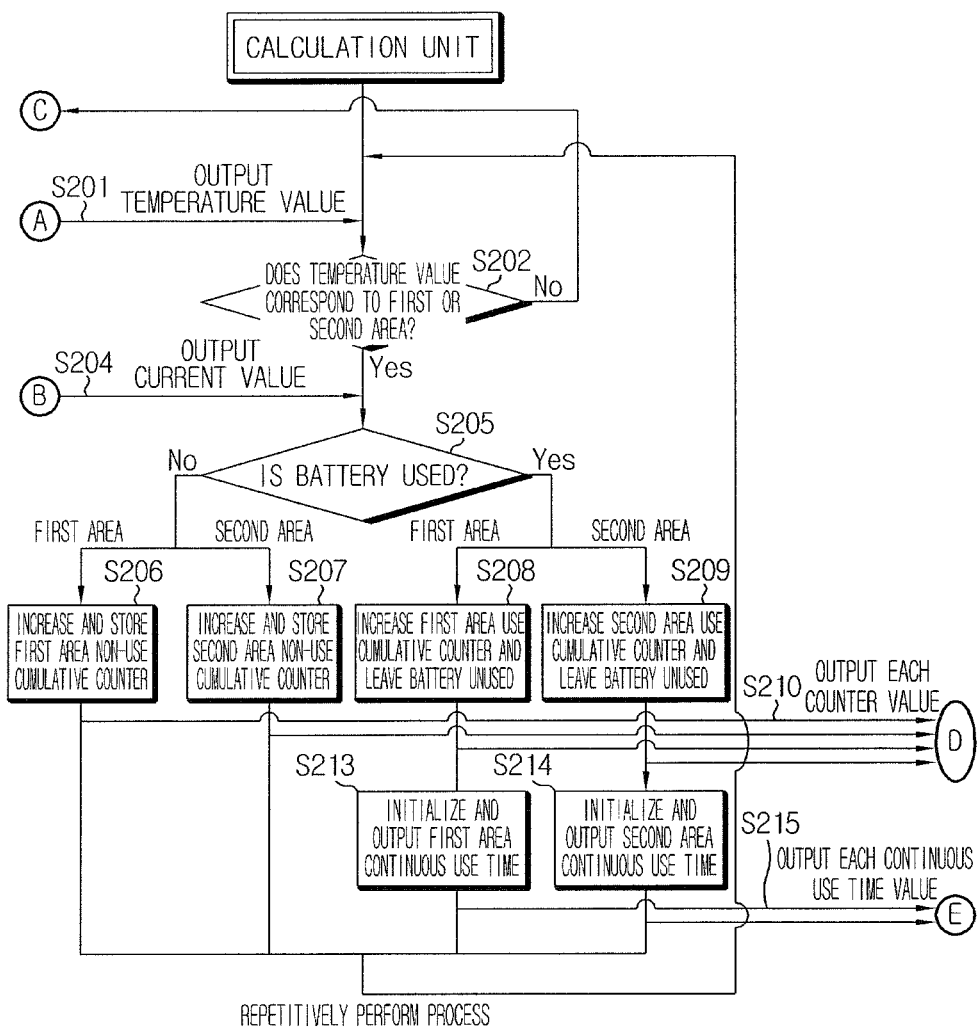
Figure 4:
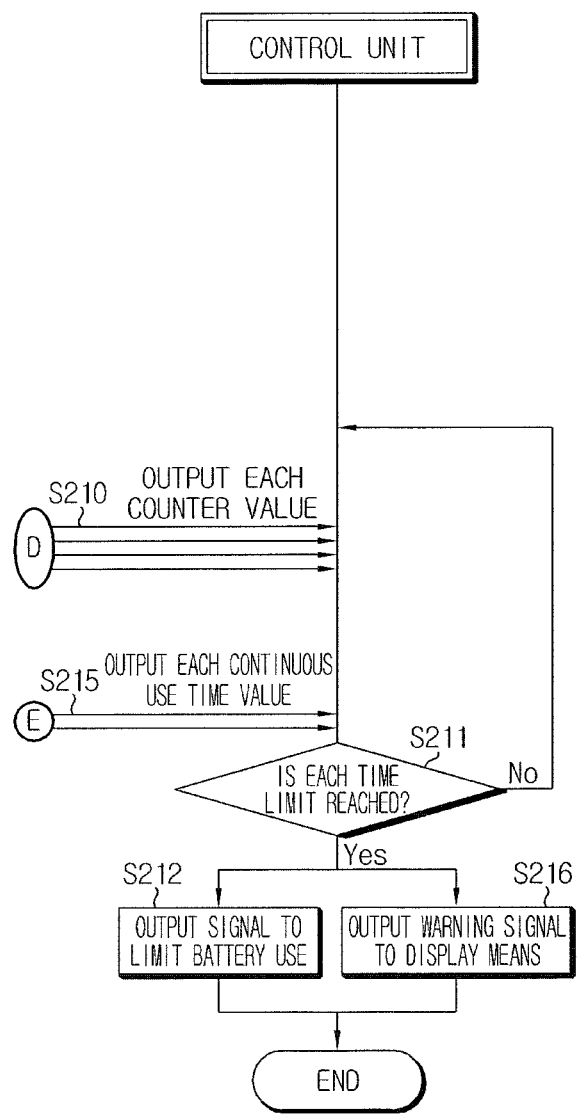

FIG. 1 is a block diagram schematically illustrating a configuration of a battery management apparatus 100 according to an exemplary embodiment. FIGS. 2 through 4 are flowcharts chronologically illustrating a battery management method according to an exemplary embodiment. The battery management apparatus and method according to the present disclosure will be described with reference to FIGS. 1 through 4.

Referring to FIG. 1, the battery management apparatus 100 according to the present disclosure includes an external temperature sensor 110, a current sensor 120, and a calculation unit 130.

The battery management apparatus 100 according to the present disclosure is connected to a battery 140 including secondary cells. The battery 140 includes at least one unit secondary cell, and there is no special limitation on a type of the secondary cell. The secondary cell is rechargeable and requires consideration of a charging or discharging voltage, and for example, includes a lithium ion battery, a lithium polymer battery, a Ni—Cd battery, a Ni-MH battery, a Ni—Zn battery, and the like. Also, the battery 140 may be constructed by connecting a plurality of secondary cells in series or parallel or in series/parallel. However, the present disclosure is not limited by a type, a number, an output voltage, and a charging capacity of the secondary cell.

The external temperature sensor 110 senses a temperature of an environment to which the battery 140 is exposed (S200). Also, the external temperature sensor 110 outputs the sensed temperature value to the calculation unit 130 (S201).

The calculation unit 130 determines whether the temperature value received from the external temperature sensor 110 corresponds to a preset first or second area (S202).

The battery management apparatus 100 according to the present disclosure may further include a memory unit 150 to store the preset first and second areas. The memory unit 150 corresponds to a high-capacity storage medium such as a semiconductor device or a hard disk that is known as being capable of recording and erasing data, for example, random access memory (RAM), read-only memory (ROM), electrical erasable programmable read-only memory (EEPROM), and the like, and encompasses any device capable of storing information regardless of a device type and is not limited to a specific memory device. With regard to a role of the memory unit 150, its detailed description will be provided below together with a function of the battery management apparatus 100 according to the present disclosure. Meanwhile, although this embodiment shows that the memory unit 150 is disposed outside the calculation unit 130, the memory unit 150 may be disposed inside the calculation unit 130.

The first or second area corresponds to a temperature area that may have physical or chemical influence on the secondary cell included in the battery 140. An example of the physical or chemical influence of the temperature on the secondary cell is an increase in degradation rate of the secondary cell. Particularly, the second area may have a stronger influence on the secondary cell than the first area. Accordingly, the first area corresponds to a temperature range over which the battery may be degraded, and the second area corresponds to a temperature range over which the battery may be degraded fast. However, the present disclosure does not merely consider an increase in degradation rate of the secondary cell as the physical or chemical influence on the secondary cell, and is not limited to the following embodiment.

According to an embodiment of the present disclosure, the first area is between 40° C. above zero and 50° C. above zero (not including 50° C. above zero), and the second area is higher than or equal to 50° C. above zero.

According to another embodiment of the present disclosure, the first area is between 20° C. below zero and 0° C. (not including 20° C. below zero), and the second area is lower than or equal to 20° C. below zero. The first and second areas may be set in a low temperature range as well as a high temperature range.

According to still another embodiment of the present disclosure, the first area is between 40° C. above zero and 50° C. above zero (not including 50° C. above zero) and between 20° C. below zero and 0° C. (not including 20° C. below zero), and the second area is between 50° C. above zero and 20° C. below zero. The first and second areas may be set in a high temperature range and a low temperature range together.

FIG. 5 is a table illustrating a brief description of the first area and the second area according to an exemplary embodiment. Referring to FIG. 5, the first area and the second area classified based on the temperature of the embodiment and a brief description of each area can be seen.

Referring to FIGS. 1 through 4 again, when the temperature value received from the external temperature sensor 110 does not correspond to the preset first or second area (NO in S202), the calculation unit 130 determines the environment to which the battery 140 is exposed as an optimum environment having less physical or chemical influence on the secondary cell.

In contrast, when the temperature value received from the external temperature sensor 110 corresponds to the preset first or second area (YES in S202), the calculation unit 130 completes the process of S202 and passes the process to S205. In this instance, the calculation unit 130 may also determine whether the temperature value received from the external temperature sensor 110 corresponds to the first area or the second area.

Meanwhile, the current sensor 120 senses an electric current of the battery 140 (S203). Also, the current sensor 120 outputs the sensed current value to the calculation unit 130 (S204).

In S205, the calculation unit 130 determines whether the current value received from the current sensor 120 is greater than, less than, or equal to 0 (S205). If the battery 140 is unused, that is, the battery 140 is not charged or discharged, the current value received from the current sensor 120 will be 0. In contrast, if the battery 140 is used, that is, the battery 140 is charged or discharged, the current value received from the current sensor 120 will be greater than or less than 0. In this instance, whether the battery 140 has a current value exceeding 0 during charging or discharging may change depending on the setting. In conclusion, if the current value received from the current sensor 120 is 0, the battery 140 is determined as not being used, and if the current value received from the current sensor 120 is not 0, the battery 140 is determined as being used.

When the current value received from the current sensor 120 is 0 (NO in S205), the calculation unit 130 passes the process to S206 or S207. S206 is performed when the temperature value received by the calculation unit 130 in S202 is determined to correspond to the first area among the first area and the second area. In S206, the calculation unit 130 increases a first area non-use cumulative counter for the time domain. The first area non-use cumulative counter represents recording of an accumulated time over which the battery 140 is left unused in the first area. The first area non-use cumulative counter may be stored in the memory unit 150. Accordingly, each time the calculation unit 130 performs the process of S206, the calculation unit 130 reads a latest first area non-use cumulative counter value stored in the memory unit 150 and accumulates a period of time during which the battery 140 is left unused in the first area at a present point in time.

In contrast, S207 is performed when the temperature value received by the calculation unit 130 in S202 is determined to correspond to the second area among the first area and the second area. In S207, the calculation unit 130 increases a second area non-use cumulative counter for the time domain. The second area non-use cumulative counter represents recording of an accumulated time over which the battery 140 is left unused in the second area. The second area non-use cumulative counter may be stored in the memory unit 150. Accordingly, each time the calculation unit 130 performs the process of S207, the calculation unit 130 reads a latest second area non-use cumulative counter value stored in the memory unit 150 and accumulates a period of time during which the battery 140 is left unused in the second area at a present point in time.

When the current value received from the current sensor 120 is greater than or less than 0 (YES in S205), the calculation unit 130 passes the process to S208 or S209.

S208 is performed when the temperature value received by the calculation unit 130 in S202 is determined to correspond to the first area among the first area and the second area. In S208, the calculation unit 130 increases a first area use cumulative counter for the time domain. The first area use cumulative counter represents recording of an accumulated time over which the battery 140 is used in the first area. The first area use cumulative counter may be stored in the memory unit 150. Accordingly, each time the calculation unit 130 performs the process of S208, the calculation unit 130 reads a latest first area use cumulative counter value stored in the memory unit 150 and accumulates a period of time during which the battery 140 is used in the first area at a present point in time.

In contrast, S209 is performed when the temperature value received by the calculation unit 130 in S202 is determined to correspond to the second area among the first area and the second area. In S209, the calculation unit 130 increases a second area use cumulative counter for the time domain. The second area use cumulative counter represents recording of an accumulated time over which the battery 140 is used in the second area. The second area use cumulative counter may be stored in the memory unit 150. Accordingly, each time the calculation unit 130 performs the process of S209, the calculation unit 130 reads a latest second area use cumulative counter value stored in the memory unit 150 and accumulates a period of time during which the battery 140 is used in the second area at a present point in time.

The foregoing steps S200 through S209 may be repetitively performed at a preset cycle.

Meanwhile, the battery management apparatus according to the present disclosure may further include a control unit 160 to output a signal for limiting the use of the battery 140.

The control unit 160 may receive the first and second area non-use cumulative counter values and the first and second area use cumulative counter values stored in the memory unit 150 (S210).

In this instance, when the received first area non-use cumulative counter value reaches a preset first area non-use time limit (YES in S211), the control unit 160 outputs a control signal to limit the use of the battery 140 (S212). In this instance, the control signal outputted to limit the use of the battery 140 may correspond to a signal for turning off a switch device 170 that controls the use of the battery 140. Although FIG. 1 briefly shows that a field effect transistor (FET) connected to a high potential terminal of the battery 140 is controlled, the present disclosure is not limited to the embodiment illustrated in the drawing.

Similarly, when the received second area non-use cumulative counter value reaches a preset second area non-use time limit, the received first area use cumulative counter value reaches a preset first area use time limit, or the received second area use cumulative counter value reaches a preset second area use time limit, the control unit 160 outputs a control signal to limit the use of the battery 140 (S212).

The first or second area non-use time limit implies that the secondary cell included in the battery 140 is very likely to degrade by the cumulative non-use time even though the battery 140 is not used in the first or second area. Also, the first or second area use time limit implies that the secondary cell included in the battery 140 is very likely to degrade by the cumulative use time when the battery 140 is used in the first or second area.

Referring to FIG. 5, an example of the first or second area use time limit is shown. In a case of the first area, the first area use time limit is 240 hours and the second area use time limit is 24 hours. The first or second area use time limit shown in FIG. 5 is just an example, and may be variously set according to the characteristics of the second cell included in the battery 140. Also, the first or second area non-use time limit may be variously set according to the characteristics of the secondary cell included in the battery 140. Meanwhile, the first or second area non-use time limit and the first or second area use time limit may be preset and stored in the memory unit 150.

According to another embodiment of the present disclosure, when the first or second area non-use cumulative counter reaches the preset first or second area non-use time limit or the first or second area use cumulative counter reaches the preset first or second area use time limit, the control unit 160 outputs a warning signal to a display means 180 (S216).

The display means 180 may display to a user that any one among the first or second area non-use time limit and the first or second area use time limit is reached, through a visual and/or auditory warning member. The display means 180 may be a lamp, a light emitting diode (LED), a buzzer, or a speaker.

According to still another embodiment of the present disclosure, when the temperature value received from the external temperature sensor 110 corresponds to the preset first or second area and the current value received from the current sensor 120 is greater than or less than 0, the calculation unit 130 calculates a first area continuous use time or a second area continuous use time (S213, S214). The continuous use time may be stored in the memory unit 150.

The continuous use time represents a period of time during which the battery 140 is continuously charged or discharged in the first area or the second area. For example, when the battery 140 is used in an environment not corresponding to the first area or the second but the environment is changed to an environment corresponding to the first area or the second area while in use, the continuous use time represents a length of time between a point in time at which the environment is changed to an environment corresponding to the first area or the second area and a point in time at which the use is stopped or the environment is changed to an environment not corresponding to the first area or the second area. As another example, when the environment corresponds to the first or second area and the battery 140 is not used but the use starts, the continuous use time represents a length of time between a point in time at which the use starts and a point in time at which the battery use is stopped or the environment is changed to an environment not corresponding to the first area or the second area.

The first and second use cumulative counter values are different from the first and second continuous use time in that a time period used in an environment corresponding to an initial first or second area has been accumulated since the battery 140 was manufactured.

Meanwhile, because the continuous use time is not a cumulative value, when confronted with the above exemplary situation, the calculation unit 130 initializes a value of a continuous use time stored in the memory unit 150 and calculates the continuous use time.

Also, the control unit 160 receives the value of the first or second continuous use time (S215), and determines whether the first or second continuous use time reaches a preset first or second area continuous use time limit (S211). The first or second continuous use time implies that the secondary cell included in the battery 140 is very likely to degrade when the battery 140 is continuously used in the first or second area.

When the received value of the first or second area continuous use time reaches the preset first and second area continuous use time limit, the control unit 160 outputs a control signal to limit the use of the battery 140 (S212).

Referring to FIG. 5, an example of the first or second area continuous use time limit is shown. The first area continuous use time limit is 10 hours and the second area continuous use time limit is 1 hour. The first or second area continuous use time limit shown in FIG. 5 is just an example, and may be variously set according to the characteristics of the second cell included in the battery 140. The first or second area continuous use time limit may be preset and stored in the memory unit 150.

According to yet another embodiment of the present disclosure, when the first or second area continuous use time reaches the preset first or second area continuous use time limit, the control unit 160 outputs a warning signal to the display means 180 (S216).

In contrast, when the received each counter value and each continuous use time value does not reach to the each time limit (NO in S211), the control unit 160 does not output a control signal and a warning signal.

Meanwhile, the battery management apparatus according to the present disclosure may further include an internal temperature sensor (not shown) to sense the temperature of the battery 140. The internal temperature sensor corresponds to a temperature sensor to measure the heat by charging and discharging of the battery 140. In this case, when the current value received from the current sensor 120 is not 0, the calculation unit 130 may determine that the battery 140 is being charged or discharged. In this instance, the calculation unit 130 stores a temperature value (hereinafter referred to as an internal temperature value) received from the internal temperature sensor. Also, the calculation unit 130 subtracts a value proportional to the internal temperature value from the temperature value received from the external temperature sensor 110, and determines whether the result corresponds to the preset first or second area. This configuration and method allows distinguishment of whether the influence of the temperature on the life of the battery 140 comes from an external environment or heat generated from the battery 140 itself. The value proportional to the internal temperature value may be variously set based on an extent to which the battery 140 is exposed to the external environment, a distance between the battery 140 and the external temperature sensor 110, an extent of insulation between the battery 140 and the external temperature sensor 110, and the like.

According to the present disclosure, information about a time domain that may affect the life or performance of the battery can be calculated in consideration of a temperature environment to which the battery is exposed. Also, information about whether the battery is simply exposed to or is applied in the temperature environment adversely affecting the battery can be calculated. Further, based on the information, a life cycle of the battery or a warranty period of a battery manufacturer can be determined.

Meanwhile, in the description of the present disclosure, it should be understood that each element or component of the battery management apparatus shown in FIG. 1 is distinguished logically rather than physically.

That is, each element or component corresponds to a logic element or component to realize the technical spirit of the present disclosure, and accordingly, it should be understood that even though each element or component is integrated or separated, it falls within the scope of the present disclosure if a function performed by a logic element or component of the present disclosure can be implemented, and it falls within the scope of the present disclosure regardless of whether names are identical or not if it is an element or component performing an identical or similar function.

Also, in the description of the embodiments of the present disclosure, although the embodiment shows that only one dependent configuration is added for the convenience of understanding, an embodiment in which a combination of at least two dependent configurations is added may be contemplated. Accordingly, the scope of the disclosure is not limited by the illustrated embodiment.

The present disclosure has been described in detail. However, it should be understood that the detailed description and specific examples, while indicating preferred embodiments of the disclosure, are given by way of illustration only, since various changes and modifications within the spirit and scope of the disclosure will become apparent to those skilled in the art from this detailed description.

What is claimed is:

1. A battery management apparatus comprising:
   an external temperature sensor to sense a temperature of an environment to which a battery is exposed;
   a current sensor to sense an electric current of the battery; and
   a calculation unit to increase a first or second area non-use cumulative counter for a time domain when the temperature value received from the external temperature sensor corresponds to a preset first or second area and the current value received from the current sensor is 0, and to increase a first or second area use cumulative counter for the time domain when the temperature value received from the external temperature sensor corresponds to the preset first or second area and the current value received from the current sensor is greater than or less than 0.

2. The battery management apparatus according to claim 1, wherein the first area is between 40° C. above zero and 50° C. above zero, not including 50° C. above zero, and the second area is higher than or equal to 50° C. above zero.

3. The battery management apparatus according to claim 1, wherein the first area is between 20° C. below zero and 0° C., not including 20° C. below zero, and the second area is lower than or equal to 20° C. below zero.

4. The battery management apparatus according to claim 1, wherein the first area is between 40° C. above zero and 50° C. above zero, not including 50° C. above zero, and between 20° C. below zero and 0° C., not including 20° C. below zero, and the second area is between 50° C. above zero and 20° C. below zero.

5. The battery management apparatus according to claim 1, further comprising:
   a control unit to output a control signal to limit the use of the battery when the first or second area non-use cumulative counter reaches a preset first or second area non-use time limit, or the first or second area use cumulative counter reaches a first or second area use time limit.

6. The battery management apparatus according to claim 1, further comprising:
   a control unit to output a warning signal to a display means when the first or second area non-use cumulative counter reaches a preset first or second area non-use time limit, or the first or second area use cumulative counter reaches a preset first or second area use time limit.

7. The battery management apparatus according to claim 1, wherein the calculation unit calculates a first or second area continuous use time when the temperature value received from the external temperature sensor corresponds to the preset first or second area and the current value received from the current sensor is greater than or less than 0, and
   the battery management apparatus further comprises a control unit to output a control signal to limit the use of the battery when the first or second area continuous use time reaches a preset first or second area continuous use time limit.

8. The battery management apparatus according to claim 1, wherein the calculation unit calculates a first or second area continuous use time when the temperature value received from the external temperature sensor corresponds to the preset first or second area and the current value received from the current sensor is greater than or less than 0, and the battery management apparatus further comprises a control unit to output a warning signal to a display means when the first or second area continuous use time reaches a preset first or second area continuous use time limit.

9. The battery management apparatus according to claim 1, further comprising:

a memory unit to store the preset first and second areas, the first and second area non-use cumulative counters, and the first and second area use cumulative counters.

10. The battery management apparatus according to claim 1, further comprising:

an internal temperature sensor to sense a temperature of the battery, wherein the calculation unit stores the temperature value (or internal temperature value) received from the internal temperature sensor when the current value received from the current sensor is non-zero, subtracts a value proportional to the internal temperature value from the temperature value received from the external temperature sensor, and determines whether the result corresponds to the preset first or second area.

11. A battery management method comprising:

a temperature measuring step of determining whether a temperature value received from an external temperature sensor to sense a temperature of an environment to which a battery is exposed corresponds to a preset first or second area;

a non-use time increasing step of increasing a first or second area non-use cumulative counter for a time domain when the temperature value received from the external temperature sensor corresponds to the preset first or second area and a current value received from a current sensor to sense an electric current of the battery is 0; and a use time increasing step of increasing a first or second area use cumulative counter for the time domain when the temperature value received from the external temperature sensor corresponds to the preset first or second area and the current value received from the current sensor to sense the electric current of the battery is greater than or less than 0.

12. The battery management method according to claim 11, wherein the first area is between 40° C. above zero and 50° C. above zero, not including 50° C. above zero, and the second area is higher than or equal to 50° C. above zero.

13. The battery management method according to claim 11, wherein the first area is between 20° C. below zero and 0° C., not including 20° C. below zero, and the second area is lower than or equal to 20° C. below zero.

14. The battery management method according to claim 11, wherein the first area is between 40° C. above zero and 50° C. above zero, not including 50° C. above zero, and between 20° C. below zero and 0° C., not including 20° C. below zero, and the second area is between 50° C. above zero and 20° C. below zero.

15. The battery management method according to claim 11, further comprising:

a use limiting step of outputting a control signal to limit the use of the battery when the first or second area non-use cumulative counter reaches a preset first or second area non-use time limit, or the first or second area use cumulative counter reaches a first or second area use time limit.

16. The battery management method according to claim 11, further comprising:

a warning step of outputting a warning signal to a display means when the first or second area non-use cumulative counter reaches a preset first or second area non-use time limit, or the first or second area use cumulative counter reaches a preset first or second area use time limit.

17. The battery management method according to claim 11, further comprising:

a continuous use time calculating step of calculating a first or second area continuous use time when the temperature value received from the external temperature sensor corresponds to the preset first or second area and the current value received from the current sensor is greater than or less than 0; and a use limiting step of outputting a control signal to limit the use of the battery when the first or second area continuous use time reaches a preset first or second area continuous use time limit.

18. The battery management method according to claim 11, further comprising:

a continuous use time calculating step of calculating a first or second area continuous use time when the temperature value received from the external temperature sensor corresponds to the preset first or second area and the current value received from the current sensor is greater than or less than 0; and a warning step of outputting a warning signal to a display means when the first or second area continuous use time reaches a preset first or second area continuous use time limit.

19. The battery management method according to claim 11, further comprising:

a storing step of storing the preset first and second areas, the first and second area non-use cumulative counters, and the first and second area use cumulative counters.

20. The battery management method according to claim 11, wherein the temperature measuring step comprises storing a temperature value (or internal temperature value) received from an internal temperature sensor to sense a temperature of the battery when the current value received from the current sensor is non-zero, subtracting a value proportional to the internal temperature value from the temperature value received from the external temperature sensor, and determining whether the result corresponds to the preset first or second area.

* * * * *